(12) United States Patent
Chang

(10) Patent No.: US 6,976,240 B2
(45) Date of Patent: Dec. 13, 2005

(54) SIMULATION USING DESIGN GEOMETRY INFORMATION

(75) Inventor: Fang-Cheng Chang, Sunnyvale, CA (US)

(73) Assignee: Synopsys Inc., Mountain View, CA (US)

(*) Notice: Subject to any disclaimer, the term of this patent is extended or adjusted under 35 U.S.C. 154(b) by 574 days.

(21) Appl. No.: 10/003,358

(22) Filed: Nov. 14, 2001

(65) Prior Publication Data

US 2003/0093251 A1    May 15, 2003

(51) Int. Cl.⁷ ................................................ G06F 17/50
(52) U.S. Cl. ...................................... 716/19; 716/5
(58) Field of Search ...................... 716/5, 19; 715/19

(56) References Cited

U.S. PATENT DOCUMENTS

| | | | |
|---|---|---|---|
| 5,282,140 A | 1/1994 | Tazawa et al. ............... 364/468 |
| 5,326,659 A | 7/1994 | Liu et al. ........................ 430/5 |
| 5,481,624 A * | 1/1996 | Kamon ........................ 382/144 |
| 5,572,598 A | 11/1996 | Wihl et al. ................... 382/144 |
| 5,757,019 A * | 5/1998 | Murai et al. ............ 250/492.22 |
| 5,795,688 A | 8/1998 | Burdorf et al. ............... 430/30 |
| 5,804,340 A | 9/1998 | Garza et al. ..................... 430/5 |
| 5,849,440 A | 12/1998 | Lucase et al. .................. 430/5 |
| 5,943,437 A * | 8/1999 | Sumie et al. ................ 382/149 |
| 6,016,357 A | 1/2000 | Neary et al. ................ 382/144 |
| 6,023,328 A | 2/2000 | Pierrat ....................... 350/237.4 |
| 6,057,063 A * | 5/2000 | Liebmann et al. .............. 430/5 |
| 6,076,465 A | 6/2000 | Vacca et al. ................. 101/481 |
| 6,078,738 A | 6/2000 | Garza et al. ............ 395/500.22 |
| 6,091,845 A | 7/2000 | Pierrat et al. ................ 382/144 |
| 6,130,750 A | 10/2000 | Ausschnitt et al. .......... 356/401 |
| 6,134,014 A * | 10/2000 | Tzu et al. .................... 356/450 |
| 6,171,731 B1 | 1/2001 | Medvedeva et al. ............ 430/5 |
| 6,225,025 B1 | 5/2001 | Hoshino ...................... 430/296 |
| 6,268,093 B1 * | 7/2001 | Kenan et al. ................ 430/30 |
| 6,272,236 B1 | 8/2001 | Pierrat et al. ................ 382/144 |
| 6,334,209 B1 | 12/2001 | Hashimoto et al. ........... 716/21 |
| 6,339,836 B1 | 1/2002 | Eisenhofer et al. ............. 716/5 |
| 6,346,426 B1 | 2/2002 | Toprac et al. ................... 438/8 |
| 2002/0019729 A1 | 2/2002 | Chang et al. ................... 703/6 |
| 2002/0035461 A1 | 3/2002 | Chang et al. ................. 703/13 |

FOREIGN PATENT DOCUMENTS

| | | |
|---|---|---|
| WO | WO 97/13370 | 4/1997 |
| WO | WO 98/20327 | 5/1998 |
| WO | WO 98/45685 | 10/1998 |
| WO | WO 99/14706 A2 | 3/1999 |
| WO | WO 99/14706 A3 | 3/1999 |
| WO | WO 99/38002 | 7/1999 |

(Continued)

OTHER PUBLICATIONS

Spence, C., et al., "Detection of 60(degree) Phase Defects on Alternating PSMs", Advanced Micro Devices, KLA-Tencor, DuPont RTC (2 pages).

(Continued)

*Primary Examiner*—Sun James Lin
(74) *Attorney, Agent, or Firm*—Bever, Hoffman & Harms, LLP; Jeanette S. Harms

(57) ABSTRACT

Design geometry information from an area outside the area of interest (AOI) on a mask can be combined with inspection information from the AOI to facilitate an accurate, simulated wafer image. The design geometry information can be easily generated or accessed, thereby ensuring an uninterrupted inspection process and minimizing the associated storage costs for the simulation process. The design geometry information can be pseudo design geometry information or actual design geometry information.

27 Claims, 8 Drawing Sheets

FOREIGN PATENT DOCUMENTS

| WO | WO 99/56113 | 11/1999 |
|---|---|---|
| WO | WO 99/59200 | 11/1999 |
| WO | WO 99/67626 | 12/1999 |
| WO | WO 00/36525 A2 | 6/2000 |

OTHER PUBLICATIONS

Stimiman, J., et al., "Spatial Filter Models to Describe IC Lithographic Behavior", Precim Corporation, Portland, Oregon (10 pages).

Sugawara, M., et al., "Defect Printability Study of Attenuated Phase-Shifting Masks for Specifying Inspection Sensitivity", Sony Corporation, Kanagawa, Japan (16 pages).

Cobb, et al., "Fast Sparse Aerial Image Calculation for OPC", SPIE, vol. 2621, pp. 534-544, Sep. 20-22, 1995.

Ogawa, K., et al., "Phase Defect Inspection by Differential Interference", Lasertec Corporation (12 pages).

Kang, D., et al., "Effects of Mask Bias on t he Mask Error Enhancement Factor (MEEF) of Contact Holes" (11 pages).

Socha, R., et al., "Printability of Phase-Shift Defects Using a Perturbational Model", Univ. of California Berkeley, Sematech (11 pages).

Adam, K., et al., "Simplified Models for Edge Transitions in Rigorous Mask Modeling", University of California Berkeley (40 pages).

Gordon, R., et al., "Mask Topography Simulation for EUV Lithography", FINLE Technologies Inc. (15 pages).

Pistor, T., "Rigorous 3D Simulation of Phase Defects in Alternating Phase-Shifting Masks", Panormaic Technology Inc. (13 pages).

Semmier, A., et al., "Application of 3D EMF Simulation for Development and Optimization of Alternating Phase Shifting Masks", Infineon Technologies AG (12 pages).

Erdmann, A.. "Topography Effects and Wave Aberrations in Advanced PSM-Technology", Fraunhofer Institute of Integrated Circuits (11 pages).

Fickowsky, P., "The End of Thresholds: Subwavelength Optical Linewidth Measurement Using the Flux-Area Technique", Automated Visual Inspection (6 pages).

Neureuther, A., et al., "Modeling Defect-Feature Interactions in the Presence of Aberrations", University of California Berkeley (10 pages).

Mathur, B.P., et al., "Quantitative Evaluation of Shape of Image on Photoresist of Square Apertures", IEEE., Transactions On Electron Devices, vol. 35, No. 3, pp. 294-297, Mar. 1988.

Neureuther, A., "Modeling Phase Shifting Masks", SPIE. 10th Annual Symposium On Microlithography, vol. 1496, pp. 80-85 (1990).

Wiley, J., et al., "Phase Shift Mask Pattern Accuracy Requirements and Inspection Technology", SPIE, Integrated Circuit Metrology, Inspection, And Process Control V, vol. 1464, pp. 346-355 (1991).

Watanabe, H., et al., "Detection and Printability of Shifter Defects in Phase-Shifting Masks", Japanese Journal of Applied Physics, vol. 30, No. 11B, pp. 3016-3020, Nov. 1991.

Watanabe, H., et al., "Detection and Printability of Shifter Defects in Phase-Shifting Masks II Defocus Characteristics", Jpn. J. Appl. Phys., vol.31, pp. 4155-4160 (1992).

Crisalle, O., et al., "A Comparison of the Optical Projection Lithography Simulators in SAMPLE and PROLITH", IEEE, Transactions On Semiconductor Manufacturing, vol. 5, No. 1, pp. 14-26, Feb. 1992.

Hosono, K., et al., "A Novel Architecture for High Speed Dual Image Generation of Pattern Data for Phase Shifting Reticle Inspection", SPIE—Integrated Circuit Metrology, Inpsection, and Process Control VI, vol. 1673, pp. 229-235 (1992).

Rieger, M., et al., "System for Lithography Proximity Compensation", Precim Company, Portland, Oregon, Sep. 1993 (28 pages).

Wiley, J., et al., "Device Yield and Reliability by Specification of Mask Defects", Solid State Technology, vol. 36 , No. 7, pp. 65-66, 70, 72, 74, 77, Jul. 1993.

Ohtsuka, H., et al., "Evaluation of Repair Phase and Size Tolerance for a Phase-Shift Mask", J. Vac. Sci. Technol. B, vol. 11, No. 6, pp. 2665-2668, Nov./Dec. 1993.

Pati, Y.C., et al., "Phase-Shifting Masks for Microlithography: Automated Design and Mask Requirements", J. Opt. Soc. Am., vol. 11, No. 9, pp. 2438-2452, Sep. 1994.

Spence, C., et al., "Automated Determination of CAD Layout Failures Through Focus: Experiment and Simulation", SPIE, vol. 2197, pp. 302-313 (1994).

Qian, Q.D., et al., "A New Scalar Planeware Model for High NA Lithography Simulations", IEEE, pp. 45-48 (1994).

Karklin, L., "A Comprehensive Simulation Study of the Photomask Defects Printability", SPIE, vol. 2621, pp. 490-504 (1995).

Wiley, J., et al., "The Effects of Off-Axis Illumination on the Printability of Opaque and Transparent Reticle Defects", SPIE., vol. 2512, pp. 432-440 (1995).

Reynolds, J., "Elusive Mask Defects: Reflectivity Variations", Solid State Technology, pp. 75-76, Mar. 1995.

Brunner, T., et al., "Approximate Models for Resist Processing Effects", SPIE, vol. 2726, pp. 198-207, Mar. 1996.

Kusunose, H., et al., "Direct Phase-Shift Measurement with Transmitted Deep-UV Illumination", SPIE, vol. 2793, pp. 251-260 (1996).

Chang, K., et al., "Accurate Modeling of Deep Submicron Interconnect Technology", TMA Times, vol. IX, No. 3 (1997).

Pati, Y.C., et al., "Exploiting Structure in Fast Aerial Image Computation for Integrated Circuit Patterns", IEEE Transactions On Semiconductor Manufacturing, vol. 10, No. 1, pp. 62-74, Feb. 1997.

Vacca, A., et al., "100nm Defect Detection Using a Dynamically Programmable Image Processing Algorithm", SPIE, vol. 3236 (1997) (Abstract Only).

Brunner, T., "Impact of Lens Aberrations on Optical Lithography", IBM J. Res. Develop., vol. 41, No. 1/2, pp. 57-67, Jan./Mar. 1997.

Tsujimoto, E., et al., "Hierarchical Mask Data Design System (PROPHET) for Aerial Image Simulation, Automatic Phase-Shifter Placement, and Subpeak Overlap Checking", SPIE, vol. 3096, pp. 163-172 (1997).

Schoenmaker, W., et al., "Theory and Implementation of an New Interpolation Method Based on Random Sampling", IMEC Technology Paper, pp. 1-35, Jan. 31, 1997.

Kubota, H., et al., "A Fast Method of Simualting Resist Pattern Contours Based on Mean Inhibitor Concentration", Jpn. J. Appl. Phys., vol. 37, pp. 5815-5820 (1998).

Vacca, A., et al., "100nm Defect Detection Using an Existing Image Acquisition System", SPIE, vol. 3236, pp. 208-221 (1998).

Fukuda, H., et al., "Determination of High-Order Lens Aberration Using Phase/Amplitude Linear Algebra", J. Vac.

Sci. Technol. B. vol. 17, No. 6, pp. 3318-3321, Nov./Dec. 1999.

Balasinksi, A., et al., "A Novel Approach to Simulate the Effect of Optical Proximity on MOSFET Parametic Yield", IEEE, pp. 37.6.1-37.6.4 (1999).

Balasinkski, A., et al., "Comparison of Mask Writing Tools and Mask Simulations for 0.16um Devices", IEEE, SEMI Advanced Semiconductor Manufacturing Conference, pp. 372-377 (1999).

Fickowsky, P., et al., "Defect Printability Measurement of the KLA-351: Correlation to Defect Sizing Using the AVI Metrology System", SPIE 19th Annual BACUS Symposium on Photomask Technology and Management Conference, pp. 1-6, Sep. 1999.

Tejnil, E., et al., "Option for At-Wavelenght Inspection of Patterend Extreme Ultraviolet Lithography Masks", SPIE Bacus '99, pp. 1-12 (1999).

Hemar, S., et al., "Finding Killer CD Variations by Full-Reticle CD Mapping", Microlithography World, pp. 4, 6, 8 & 10 (Summer 2000).

Lin, B.J., et al., "Single-Level Electric Testsites for Phase-Shifting Masks", SPIE, vol. 1673, pp. 221-228, Mar. 9-11, 1992.

Cobb, N., "Fast Optical and Process Proximity Correction Algorithms for Integrated Circuit Manufacturing", Dissertation, University of California at Berkeley, UMI Microform 9902038 (139 pages).

Uhring, W., et al., "Model of an Instrumented Opto-Electronic Transmission System in HDL-A and VHDL-AMS", SPIE, vol. 3893, pp. 137-146, Oct. 1999.

Granik, Y., et al., "Sub-Resolution Process Windows And Yield Estimation Technique Based On Detailed Full-Chip CD Simulation", SPIE, vol. 4182, pp. 335-341 (2000).

* cited by examiner

SIMULATION USING DESIGN GEOMETRY INFORMATION

BACKGROUND OF THE INVENTION

1. Field of the Invention

The invention relates to simulating an area of interest on a lithographic mask, and specifically to using design geometry information outside the area of interest to improve the accuracy of the simulation.

2. Discussion of the Related Art

To fabricate an integrated circuit (IC) on a semiconductor substrate, a physical representation (i.e. a pattern) of the IC is transferred onto a pattern tool. Then, the pattern tool is exposed to transfer this pattern onto the semiconductor substrate. A mask is a standard pattern tool used in IC processing. Typically, a mask includes patterns that can be transferred to the entire semiconductor substrate (for example, a wafer) in a single exposure. A reticle, another standard pattern tool, must be stepped and repeated to expose the entire substrate surface. For ease of reference herein, the term "mask" refers to either a reticle or a mask.

In high-density IC designs, those skilled in the art of IC fabrication have recognized the importance of using masks that provide accurate representations of the original design layout. Unfortunately, a "perfect" mask is not commercially viable. In fact, even under optimal manufacturing conditions, some mask defects can occur outside the controlled process. A defect on a mask is any deviation from the design database (i.e. an irregularity) that is deemed unacceptable by an inspection tool or an inspection engineer.

After fabrication, the mask can be inspected for defects by scanning the surface of the mask and capturing images of the mask with an inspection tool. Defects in the mask are typically identified in a list by their locations. In one embodiment, the mask has an associated grid pattern and the list designates the squares in the grid pattern in which the defects are located. This inspection and defect identification can be performed by specialized equipment/software provided by companies such as KLA-Tencor or Applied Materials.

A captured image of the mask can be used to produce a simulated wafer image, thereby facilitating defect correction of the mask. FIG. 1 illustrates a simplified system 100 including a simulation engine 102 receiving mask inspection input 101 and generating wafer simulation output 103. Mask inspection input 101 can include image information from an inspected lithographic mask, whereas wafer simulation output 103 can include simulated wafer information generated by using the mask inspection input 101. The simulated wafer information could include, for example, a bit map of an area of interest including a defect, specific data regarding a critical dimension of a feature including a defect, and/or a severity score associated with a defect. Simulation engine 102 can be implemented using known tools, such as the Virtual Stepper® System (VSS) tool licensed by Numerical Technologies, Inc.

Mask inspection input 101 can be stored for subsequent use by simulation engine 102. However, because of the high cost associated with this storage, the amount of mask inspection input 101 is minimized, if possible. In fact, in one known inspection process, when simulation engine 102 receives a captured image from the mask, an inspection engineer performs a manual analysis of that image before the simulation proceeds. In this manner, the number of images that will be stored and simulated is decreased, thereby minimizing associated storage costs.

As features on lithographic masks get smaller, the resolution of inspection tools is typically increased to ensure that areas of interest on those masks can be adequately analyzed. Therefore, as the resolution increases, more data is stored per unit of area associated with a captured image. To minimize the need for more data storage, the maximum size of an image that can be captured by an inspection tool is typically reduced. In other words, as the resolution of inspection tools is increased, the maximum field of view of the captured images is generally reduced. More generally, although a high magnification image offers a better resolution than a low magnification image, it is not possible to get the entire environment on the high resolution image because of current $k_1$, which measures lithography aggressiveness related to the critical dimension (CD) (specifically, CD=$k_1$×(wavelength/numerical aperture)).

An area of interest on a mask, typically including a defect, can be smaller than or equal to the size of the captured image. In one simulation engine, the user can define the area of interest by using a mouse in a click-and-drag motion over a captured image from the mask. In another simulation engine, the area of interest can be system defined based on a number of criteria including, for example, the size, type, and/or orientation of a defect in light of certain features neighboring the defect. Alternatively, in one inspection tool, the user can define the area of interest using the same method described above or a different method. In another inspection tool, the size of the area of interest can be system defined based on the same criteria listed above or different criteria. Generally, the information associated with the area of interest, rather than the captured image, is stored for further processing by the simulation engine.

Including information regarding proximate features outside the area of interest can advantageously improve the accuracy of the simulated wafer image. Note that the term "proximate" can refer to any feature that has an effect on a critical dimension (CD) of a feature or final results in the area of interest as a result of its proximity to the area of interest. For example, in one implementation explained in further detail below, any feature within a predetermined distance of the area of interest can be identified as a proximate feature. Further, the feature may be "within" the area of interest, e.g. a portion of the feature is within the area.

Therefore, for the moment ignoring the associated storage costs, it would be advantageous to provide a captured image with a larger field of view. However, if the inspection tool attempts to generate a larger captured image, then the resolution of that captured image can be adversely affected. For example, a larger captured image may result in the defect not even being seen.

Alternatively, if one inspection tool could not provide the desired captured image size (and resolution), then the mask could be transferred to another inspection tool providing the desired captured image size (and resolution). However, this transfer in an otherwise automated process causes an interruption, which has a high associated cost. Moreover, inspection tools that could provide an enhanced resolution while still generating an extra large captured image would be extremely expensive and probably take an unacceptable amount of time to generate such an image.

Note that a standard inspection tool could generate multiple captured images and then "stitch" together those images to form a mega image. However, each captured image processed by simulation engine 102 is typically represented by pixels, i.e. a significant amount of data. As described previously, storing this amount of data can be very expensive. Therefore, forming a mega image for each area of interest, which logically requires significantly greater storage needs than a single image, could be prohibitively expensive solely because of storage costs. It may also slow the inspection process by requiring capturing multiple inspection tool images out of standard process order.

Therefore, a need arises for accurately simulating areas of interest on a lithographic mask while minimizing costs associated with interruption of the inspection process and storage of the captured images.

SUMMARY OF THE INVENTION

A method of simulating an area of interest (AOI) on a mask is provided. The method includes identifying the AOI, generating an inspection image of the AOI, and providing design geometry information regarding an area outside the AOI. The simulation of the AOI can be performed based on the inspection image and the design geometry information, thereby facilitating an accurate, simulated image.

The design geometry information can be easily generated or accessed, thereby ensuring an uninterrupted inspection process and minimizing the associated storage costs for the simulation process. For example, the design geometry information can include generated extensions of geometries for a feature in the AOI. In another example, the design geometry information can include information accessed in a GDS-II file, a MEBES file, or a bit map. In one embodiment, the design geometry information can be modified to create a virtual image of the area outside the AOI. The inspection image and the virtual image can be combined, wherein the simulation can be performed on the combined images. Generating the virtual image and combining the images can be done by an inspection tool, a simulation engine, or another tool in the inspection system.

Data for a simulation engine is also provided. The data includes first information from an inspection tool, wherein the first information relates to a first area. The data also includes second information from a design file, wherein the second information relates to a second area outside the first area. In one embodiment, the second area can be defined by a predetermined distance from a perimeter of the first area. In another embodiment, the second area can be defined by a plurality of distances from a perimeter of the first area. The first area can be user or system defined. Typically, the second area is system defined.

A method of improving simulation accuracy for an area of interest on a mask is also provided. The method includes generating a mask inspection image having a defined area, wherein simulating the mask inspection image provides a first accuracy. The method further includes combining the mask inspection image with design geometry information outside the defined area to create a composite image, wherein simulating the composite image provides an improved accuracy compared to the first accuracy.

A computer program product for simulating an area of interest (AOI) on a mask is also provided. The computer program product includes a first set of instructions for receiving inspection information regarding the AOI, a second set of instructions for receiving design geometry information regarding an area outside the AOI, and a third set of instructions for performing a simulation of the AOI based on the inspection information and the design geometry information. Generally, the area outside the AOI can be any relevant geometry and/or phase information not available directly from the AOI, e.g. information regarding another associated mask.

DETAILED DESCRIPTION OF THE DRAWINGS

In accordance with one feature of the invention, design geometry information outside the area of interest (AOI) on a mask can be combined with inspection information from the AOI to facilitate generating an accurate, simulated wafer image. The design geometry information can be easily generated or accessed, thereby ensuring an uninterrupted inspection process and minimizing the associated storage costs for the simulation process. As explained in further detail below, the design geometry information can be pseudo design geometry information or actual design geometry information. Note that for simplicity of illustration the captured images described herein are shown with sharp corners and high resolution defects, whereas real captured images would typically have rounded corners and defects of lower resolution.

Figure 1:
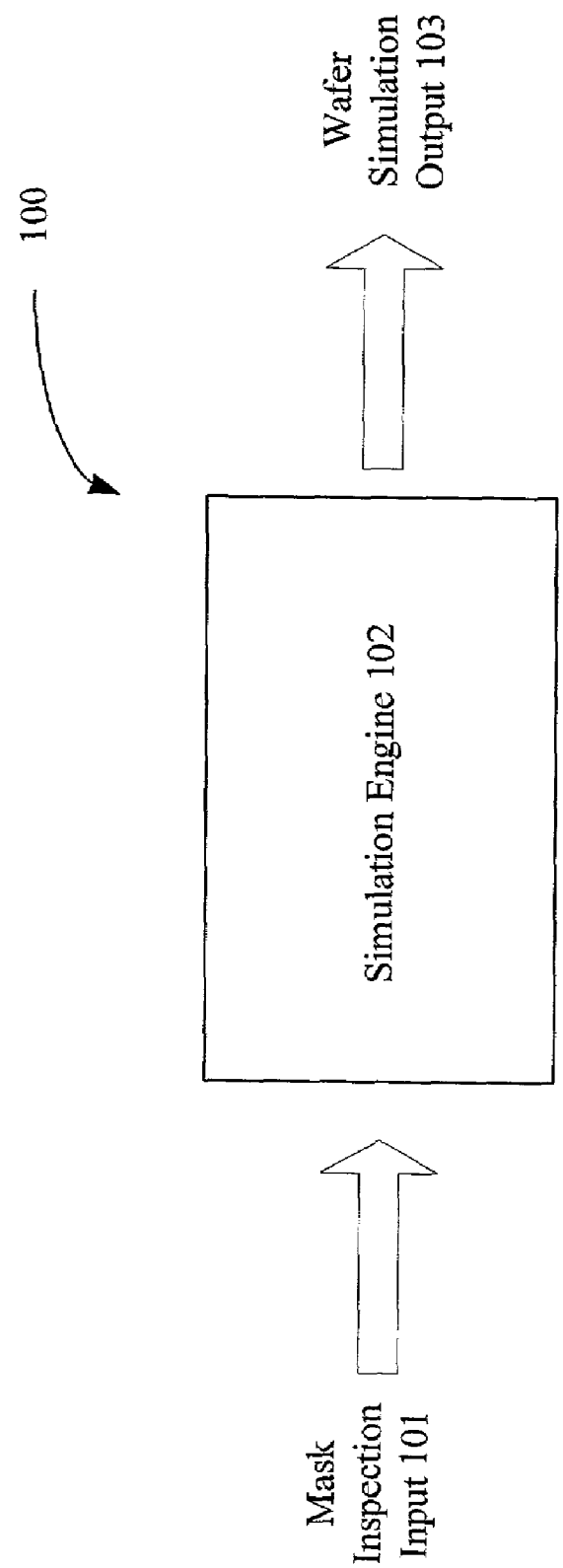
FIG. 1 illustrates a simplified system including a simulation engine receiving inspection information from a lithographic mask and generating simulated information regarding a wafer.
Figure 2A:
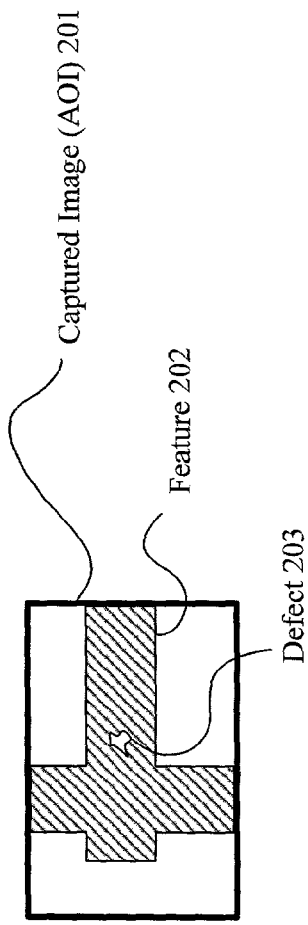
FIG. 2A illustrates an exemplary area of interest (AOI), wherein the AOI includes a portion of a feature having a defect thereon.

FIG. 2A illustrates a captured image 201 of a feature 202 including a defect 203. In one embodiment, captured image 201 could be generated by any inspection tool including an image acquirer, e.g. a scanning electron microscope (SEM) or an optical microscope system. For simplicity, assume that captured image 201 is also the area of interest (AOI).

Figure 2B:
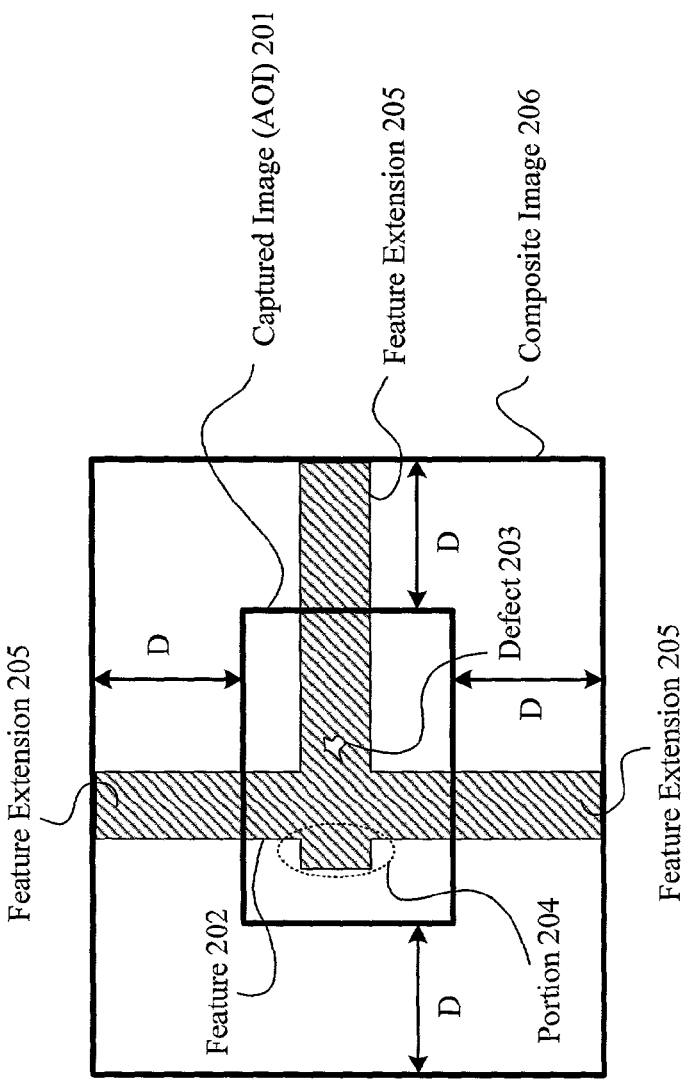
FIG. 2B illustrates the AOI of FIG. 2A combined with pseudo design geometry information, i.e. feature extensions.

In one embodiment, to provide a more accurate simulated wafer image of feature 202 and defect 203, pseudo design geometry information can be used. Specifically, any non-capped geometries that appear to end at the perimeter of an AOI can be extended to a predetermined distance. Thus, in FIG. 2B, the three non-capped geometries of feature 202 could be extended a distance D to form feature extensions 205. Note that portion 204 of feature 202 is capped, e.g. is terminated within AOI 201, and therefore is not extended. AOI 201 and feature extensions 205 comprise a composite image 206.

Proximate features or portions of features outside the AOI can affect the printing of any feature and/or defect within the AOI. Thus, even pseudo features, i.e. feature extensions 205, that are inferred from the geometries of feature 202 can measurably improve the accuracy of the simulated wafer image of AOI 201. Advantageously, feature extensions 205 can be quickly generated and in turn can be incorporated into or used in conjunction with a simulation engine.

In some lithographic systems, a mask feature is reduced in size when it is printed on the wafer. For example, reduction-projection optics or magnetic lenses can be used to produce an N:1 de-magnified image of the mask feature at the wafer. Thus, a feature having a critical dimension of X microns would actually print on the wafer as a feature having a critical dimension of X/N microns.

Providing design geometry information advantageously increases the area of valid information associated with the simulated wafer image of the AOI. For example, assuming an N:1 reduction ratio and AOI 201 (FIG. 2A), the simulated wafer image of feature 202 would be 1/N the size of feature 202. However, the amount of valid information associated with this simulated wafer image would be significantly less than 1/N the area of AOI 201. In contrast, if both AOI 201 and feature extensions 205 (i.e. composite image 206 in FIG. 2B) were used in the simulation, then the amount of valid information associated with the simulated wafer image of feature 202 could be increased to approximately 1/N the area of AOI 201, i.e. approximately the same size as the simulated wafer image. Thus, the area of valid information associated with the AOI significantly increases with the inclusion of design geometry information in the simulation process. Note that the area of valid information can also define a measurement for the "accuracy" or "quality" of the simulated wafer image.

Providing pseudo design geometry information, although improving the simulation process, relies on inferred geometries that may or may not actually approximate the real layout. Logically, the closer one can approximate the real layout, the more accurate the simulated wafer image. Therefore, in another embodiment, actual, readily available design geometry information can be used.

The actual design geometry information can be provided by any one of several known databases. For example, in a typical mask fabrication process, an engineer designs the mask layout in GDS-II format and sends this layout to a mask shop. The mask shop can use a CATS™ tool, licensed by Numerical Technologies, Inc., to receive the GDS-II file, break the geometries of the GDS-II file into the geometries that a mask fabrication machine can use (a process commonly called "fracturing"), and output a MEBES (or another vendor specific mask fabrication format) file. In this example, the GDS-II file and/or the MEBES file could provide the actual design geometry information. However, any input file including design geometry information from the actual mask being inspected could provide the actual design geometry information.

Figure 3A:
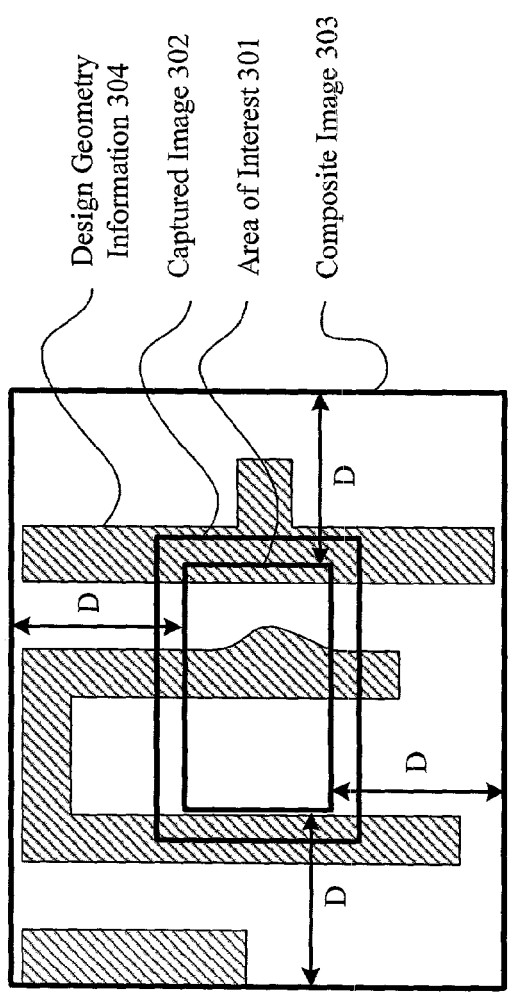
FIG. 3A illustrates another AOI on a mask combined with actual design geometry information.

FIG. 3A illustrates an area of interest (AOI) 301 defined within a captured image 302. The perimeter of a composite image 303 is defined as a distance D from AOI 301. In one embodiment, AOI 301 comprises inspection information and the area outside of captured image 302 but within composite image 303 comprises actual design geometry information 304 (provided by, for example, a GDS-II file or a MEBES file with appropriate magnification and positioning adjustments). To decrease storage needs while substantially providing the same accuracy, the inspection information provided within captured image 302 and outside AOI 301 can be replaced with actual design geometry information from the same or a different file as actual design geometry information 304.

Figure 3B:
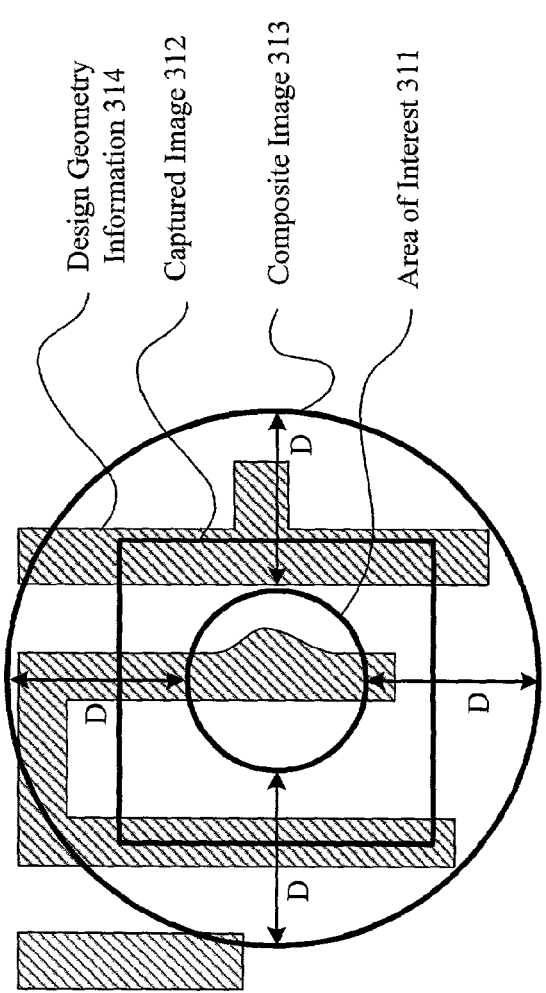
FIG. 3B illustrates another shape for an AOI and a corresponding composite image.

FIG. 3B illustrates another shape for an AOI 311 and a composite image 313. Specifically, in this case both AOI 311 and composite image 313 are circles, whereas a captured image 312 is a square. Note that design geometry information 314 outside of the perimeter for composite image 313 is shown for illustration in FIG. 3B, but would be ignored for purposes of generating the simulated wafer image.

In one embodiment, the possible shapes for the AOI, the captured image, and the composite image are dependent upon the tools used in the mask inspection and mask simulation processes. For example, the inspection tool could provide a predetermined shape for the captured image. In a similar manner, a simulation engine could provide a predetermined shape for the AOI and the composite image.

However, in another embodiment, the shapes of the AOI, the captured image, and the composite image can be varied by the user or automatically by the tools used in the inspection and simulation processes. Thus, the inspection tool could determine an appropriate shape for the captured image based on feature density and/or orientation, the user could select the desired shape for the AOI, and the simulation engine could determine an appropriate shape for the perimeter of the composite image, perhaps using the same criteria as the inspection tool.

Figure 3C:
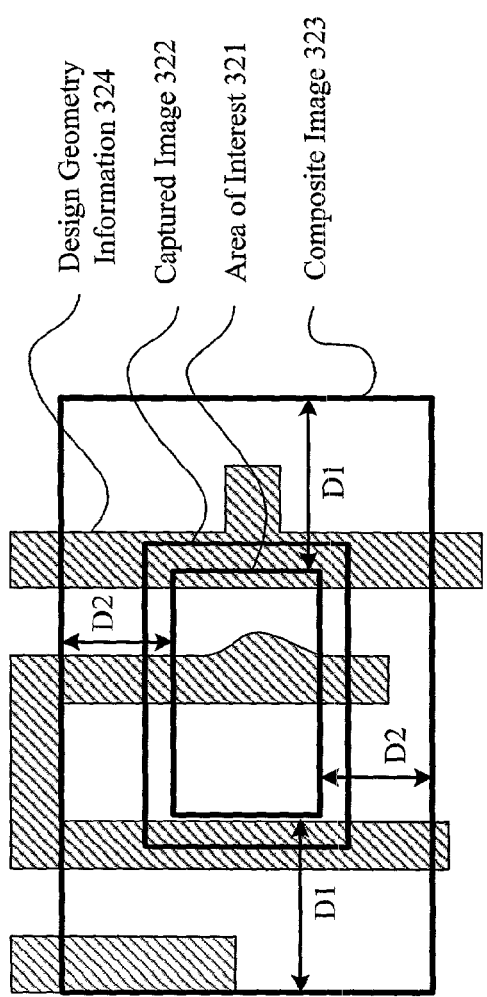
FIG. 3C illustrates a composite image that is placed a horizontal distance D1 from an AOI and a vertical distance D2 from the AOI.
Figure 3D:
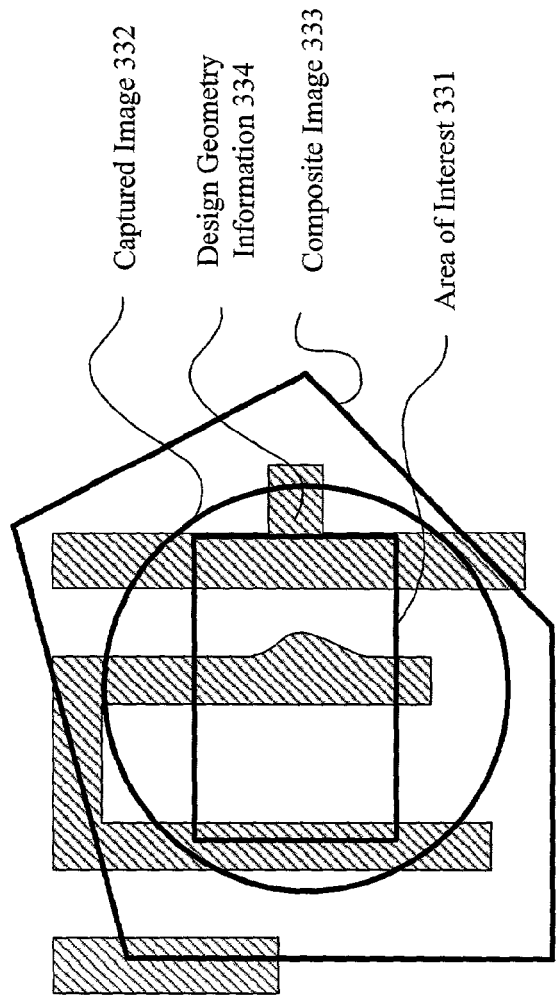
FIG. 3D illustrates a composite image that includes an irregular perimeter.
Figure 3E:
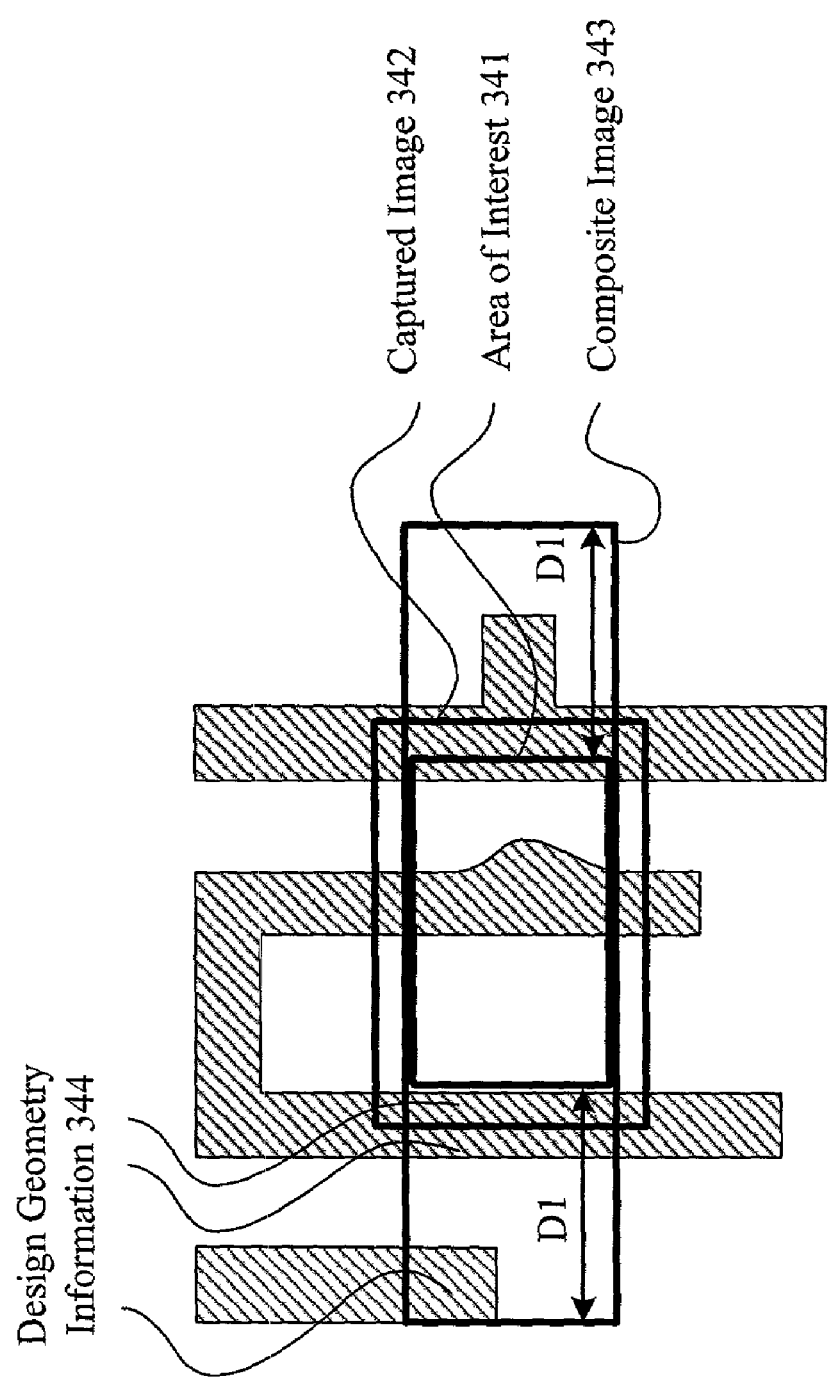
FIG. 3E illustrates a composite image that includes a perimeter that, in part, is substantially the same as the perimeter for the AOI.

More than one distance from the AOI to the perimeter of the composite image can be provided. For example, FIG. 3C illustrates a composite image 323 that is placed a horizontal distance D1 from an AOI 321 and a vertical distance D2 from AOI 321. Different horizontal and vertical distances could be provided based on the orientation of the defect within AOI 321 or the types of features comprising design geometry information 324 and/or captured image 322. FIG. 3D illustrates a composite image 333 that includes an irregular perimeter. Specifically, a captured image 332 has a circular shape, an AOI 331 has a rectangular shape, and composite image 333 has an irregular polygon shape. In one embodiment, the polygon shape could be determined based on the orientation of the defect within AOI 331 or the types of features comprising design geometry information 334 and/or captured image 332. FIG. 3E illustrates a composite image 343 that is positioned a horizontal distance D1 from an AOI 341, but substantially shares the top and bottom perimeters of AOI 341. In one embodiment, the perimeters of composite image 343 could be determined based on the orientation of the defect within AOI 341 or the types of features comprising design geometry information 344 and/or captured image 342.

Note that the file format for the design geometry information (either pseudo or actual) may not match the format of the AOI, i.e. the inspection information. Therefore, in one embodiment, the inspection tool can be adapted to receive the design geometry information and then combine this design geometry information with the inspection information before it is provided to a simulation engine. For example, the inspection tool could generate a bit map from the received design geometry information and then "stitch" the images together to form the composite image. In another embodiment, a separate tool could generate the bit map and stitch the images together. In yet another embodiment, the simulation engine could be adapted to receive the design geometry information and then combine this design geometry information with the inspection information. Note that in other embodiments the design geometry information can be merely interpreted and not modified to conform to the format of the inspection information. In other words, format modification may be unnecessary where the tool receiving the input can appropriately respond to the feature proximity information outside the AOI.

In one embodiment, to ensure valid output from the simulation engine, a dimension of the AOI, e.g. length, width, diameter, etc., can be compared to one or more distances from the perimeter of the composite image to the AOI. In another embodiment, the area associated with the AOI can be compared to the area associated with the composite image. In either case, if the appropriate relationship between the inspection information and the design geometry information is not met, then the simulation engine could issue a warning to the user or a corrective, feedback signal to the tool providing the AOI indicating that a larger AOI is needed to provide valid results.

Figure 4:
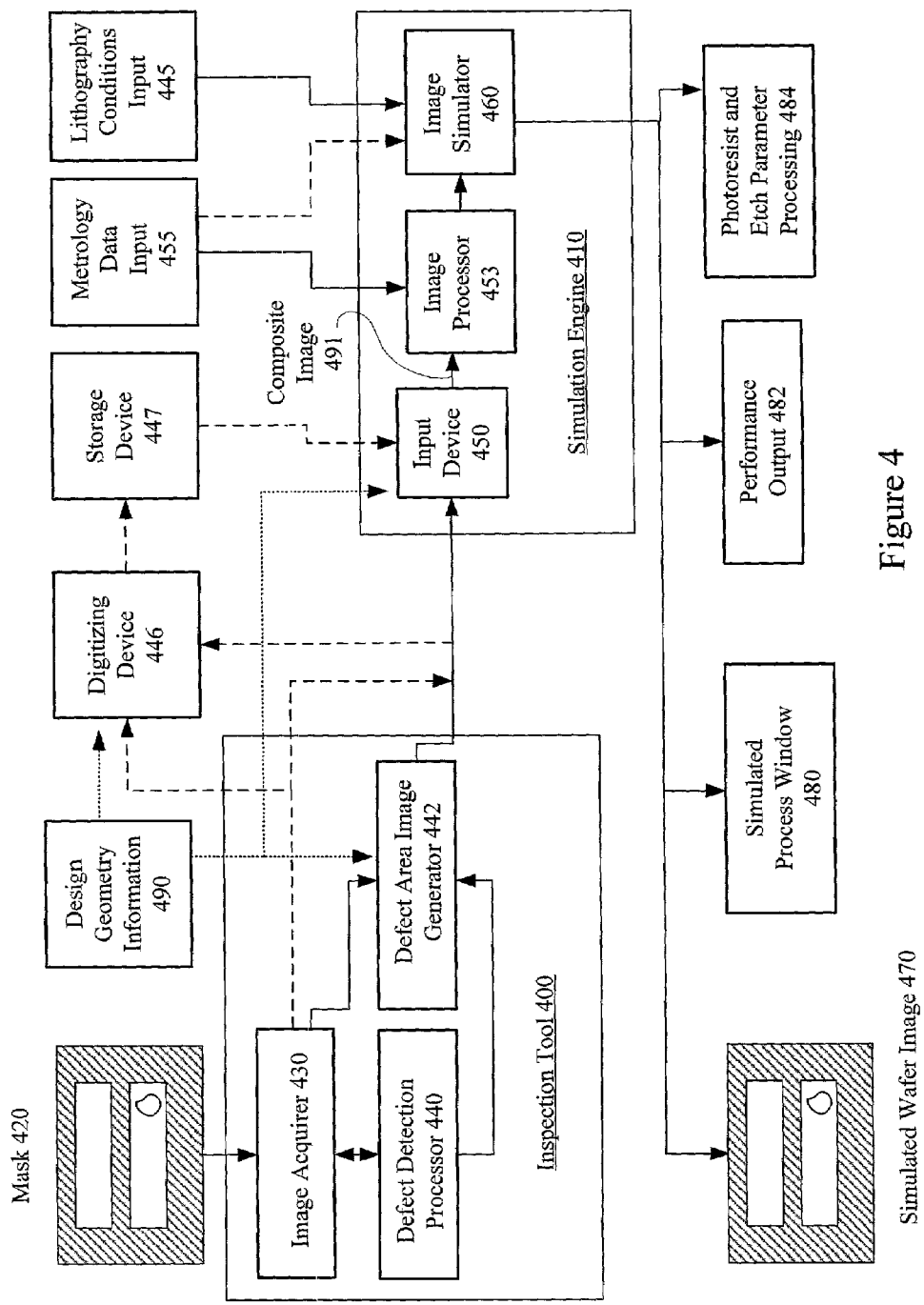
FIG. 4 illustrates, in simplified process flow diagram form, an exemplary process of analyzing a mask for defects.

FIG. 4 illustrates, in simplified process flow diagram form, an exemplary process of analyzing a mask for defects. The process utilizes an inspection tool 400 and a simulation engine 410. Inspection tool 400 may comprise an image acquirer 430, a defect detection processor 440, and a defect area image generator 442. In one embodiment, inspection tool 400 may be all-inclusive in that it contains each of the aforementioned elements in one package. This all-inclusive tool setup is typically used in on-line mask inspection. In another embodiment, inspection tool 400 may comprise a number of separately existing elements which interface with each other as is typically used in off-line mask inspection. For example, in one embodiment, image acquirer 430 is a separate device from defect detection processor 440.

Image acquirer 430 may comprise a high-resolution imaging device such as a high resolution optical microscope, a scanning electron microscope (SEM), a focus ion beam, an atomic force microscope, or a near-field optical microscope, all of which are well known in the art of mask inspection. Image acquirer 430 may also comprise a device such as a CCD camera capable of interfacing with the particular type of microscope used and digitizing the image information from the microscope. For instance, a CCD camera that creates n-bit gray scale image data that is representative of the image from the microscope may be used. The image data may be stored in a format such as Windows BMP on any type of appropriate media including a computer hard disk drive, a CDROM, and a server. Image acquirer 430 can scan all or a portion of a mask 420.

Defect detection processor 440 controls image acquirer 430. In one embodiment, defect detection processor 440 provides control signals that control the manner in which image acquirer 430 scans the mask. Further, defect detection processor 440 compares the mask images provided by image acquirer 430 to a set of potential defect criteria and determines what areas of mask 420 contain potential defects. In one embodiment, defect detection processor 440 comprises a computer running a program of instructions and interfacing with image acquirer 430 such that the scanning of the mask is done in the desired manner. In one embodiment, the program operates such that a user may change the parameters of the scanning performed on mask 420. In another embodiment, image acquirer 430 could be replaced with a preexisting image of a mask or a portion of a mask. Any representation of a physical mask that is capable of being analyzed by defect detection processor 440 is acceptable as an input.

Defect detection processor 440 also controls defect area image generator 442 that provides images of those areas of mask 420 which may contain defects. For instance, as image acquirer 430 provides image input scanned from mask 420 to defect detection processor 440, defect detection processor 440 determines whether that portion of the scanned mask contains any potential defect areas based on predetermined defect criteria. In one embodiment, a user can change these criteria. If a potential defect is discovered, defect processor 440 signals defect area image generator 442 to provide a defect area image of the area surrounding the potential defect, i.e. the captured image described above in detail.

In one embodiment, a user can also change the shape of the captured image using defect detection processor 440. Additionally, defect area image generator 442 can be modified to provide a system generated AOI or accept a user defined AOI and then combine design geometry information 490 with the AOI, i.e. the inspection information, provided by image acquirer 430. Thus, defect area image generator 442 can generate a captured image or, if able to generate an AOI and receive design geometry information 490, a composite image. In another embodiment, multiple simulated results can be provided, wherein each simulated result assumes a probable phase assignment. For example, the worst case, best case, and/or some weighted average of the simulated results can be provided to the user.

In one embodiment, defect area image generator 442 can be a part of image acquirer 430 and defect area image generator 442 can include the CCD camera of image acquirer 430. In another embodiment, defect area image generator 442 can be a separate device that receives image input from image acquirer 430. In yet another embodiment, defect area generator 442 can include a computer running a program of instructions to provide/accept the AOI and combine the design geometry information and AOI.

An inspection tool 400 can be utilized to provide data for simulation engine 410 in a number of ways. First, image acquirer 430 could scan the entire mask 420 or a portion of mask 420 under the control of defect detection processor 440 and store the captured/AOI/composite image in a storage device 447 (such as a server) after digitizing the data with a digitizing device 446 (such as an image grabber). If inspection tool 400 is unmodified, then digitizing device 446 could be adapted to provide an appropriate AOI or accept a user defined AOI, receive design geometry information 490, and combine the design geometry information with the AOI. In one embodiment, digitizing device 446 can include a computer running a program of instructions to provide/ accept the AOI and combine the design geometry information and AOI. In any case, the resulting image information can be stored in storage device 447 for later off-line inspection.

Second, the inspection information from inspection tool 400 could be provided directly to simulation engine 410 via a real time data feed for on-line inspection. If inspection tool 400 is unmodified, then an input device 450 of simulation engine 410 could be adapted to provide an appropriate AOI or accept a user defined AOI, receive design geometry information 490 from inspection tool 400, and combine the design geometry information with the AOI.

Input device 450, in the case of stored image data from storage device 447, may comprise any hardware suitable for reading the type of media upon which the image data is stored, including a computer hard disk drive, a CDROM reader, and a personal computer attached to a server via a network, among others. In the case of a real time feed of image data from defect area image generator 442 or image acquirer 430, input device 450 may comprise a digitizing device, such as an image grabber. For instance, in one embodiment, input device 450 may comprise an 8-bit frame grabber device such as those that are known in the art including the Matrox™, Meteor™, and Pulsar™ devices. In another embodiment, input device 450 can include a computer running a program of instructions to provide/accept the AOI and combine the design geometry information and AOI.

Simulation engine 410 also receives other input data such as lithography conditions input 445. In one embodiment, image simulator 460 comprises a computer-implemented program that accepts the composite image 491 (either stored image data or real time feed) from input device 450, and produces a simulated wafer image 470 of mask 420. In this computer-implemented embodiment, the program may be run on a variety of computer platforms including: a PC using the Windows 95™ or NT™ 4.0 operating system with 128 MB of RAM and a 200 MHz Pentium Pro™ microprocessor, either stand alone or connected to a network, and a SUN™ workstation computer among others.

In one embodiment, inspection tool 400 and simulation engine 410 operate to produce a simulated wafer image 470, a simulated process window 480 for mask 420, and/or other performance output 482 used to characterize, define, or measure the effect of a defect on integrated circuit performance. Performance output 482 can include a defect severity score, i.e. an objective numerical standard that can be used to judge the potential effect(s) of the defect on the printed wafer. In one embodiment, the defect severity score can be calculated based on a number of factors relating to the changes in the critical dimensions of features proximate to the defect. Certain other aspects of the mask relating to mask quality, such as line edge roughness and contact corner rounding, can also be quantified and provided as performance output 482.

In accordance with one feature of the present invention, input device 450 provides composite image 491 to an image processor 453 that can identify the intensity transitions of the composite image. For example, if image processor 453 identifies two intensities in the composite image, then a transition between these two intensities defines an edge of a feature in composite image 491.

In one embodiment, image processor 453 can also receive metrology data input 455 to more accurately interpret the intensity transition information. Specifically, metrology data input 455 can include data related to mask 420. For example, if mask 420 is an attenuated PSM mask or a tri-tone attenuated PSM mask, then metrology data input 455 can include certain data, such as the phase and the transmission, associated with the features on mask 420. In yet another example, if mask 420 is a EUV mask, then metrology data input 455 can include certain data, such as the reflectivity of the reflective stack.

For example, if metrology data input 455 indicates that mask 420 is a tri-tone attenuating mask, then an area identified as having an intensity of approximately 0.8 can be interpreted by image processor 453 as a clear area with an associated transmission of 1.0 and a phase of 0 degrees, an area identified as having an intensity of approximately 0.5 can be interpreted as an attenuating area with an associated transmission of 0.035 and a phase shift of 180 degrees, and an area identified as having an intensity of approximately 0.1 can be interpreted as the opaque area with a transmission of 0.0. In other words, in one embodiment, metrology data input 455 can merely include specification data relating to mask 420. In another embodiment, inspection tool 400 can provide additional, measured information regarding mask 420, thereby allowing image processor 453 to determine the actual phase and transmission of the attenuated/clear/opaque areas in the composite image. In either embodiment, once receiving metrology data input 455 and the composite image, image processor 453 can assign both phase and transmission data to each area within the composite image.

Note that in an alternative embodiment, image processor 453 can simply identify the intensity transitions. In this embodiment, image simulator 460 can receive both the intensity transition information from image processor 453 as well as metrology data input 455. Thus, image simulator 460 can, in addition to providing the functionality described below, interpret the intensity transition information, i.e. identify the phase and transmission for each area on the composite image. In either embodiment, metrology data input 455 can increase the accuracy of the simulations generated by image simulator 460 for non-standard photolithographic masks, such as PSM or NGL masks.

In one embodiment, mask 420 could be a trim mask used in an alternating PSM process. Advantageously, design geometry information 490 could include information regarding the corresponding mask that includes phase shifting regions. In this manner, simulation engine 410 can more accurately analyze the trim mask. Note that the phase shifting mask could also be analyzed as mask 420 and information regarding the corresponding trim mask could be provided as design geometry information 490. In this case, a defect in the area of interest on the alternating PSM could have one of two phases, which in the absence of additional information cannot be discerned. In one embodiment, two simulated results could be provided, i.e. one result assuming a first phase and another result assuming a second phase, thereby providing the user with the worse case scenario. Alternatively, based on the design geometry information 490, the user can be provided with the more probable result. This design geometry technique can be advantageously used for any multiple exposure mask having any number of phases.

Note that inspection tool 400 can introduce some distortion into the captured image or the composite image. Specifically, depending on the technology used by image acquirer 430, the phase shifting or NGL aspects of mask 420 may cause the captured features in the defect area image to be different, e.g. smaller, than the actual feature in mask 420. In one embodiment, image processor 453 or image simulator 460 can compensate for this distortion.

Image simulator 460 also can receive lithography conditions input 445. Lithography conditions input 445 contains data that is specific to the lithography conditions and system parameters under which mask 420 is to be later exposed if it passes inspection. This data may include parameters such as the numerical aperture of the system (NA), the coherency value of the system ($\sigma$), the wavelength of the illumination being used in the system ($\lambda$), the defocus of the exposure, lens aberrations, substrate conditions and the critical dimensions of the design among others. Further, lithography conditions input 445 may contain a range of these parameters such that the simulation can be performed a number of times for different combinations of these parameters. In this manner, the printability of a mask defect can be analyzed over a range of possible lithography conditions, and the effect of a potential mask defect on the process window can also be analyzed.

In one embodiment, image simulator 460 receives composite image 491 (via input device 450 and via image processor 453), lithography conditions input 445, and metrology data input 455 and generates simulated wafer image 470 (i.e. a simulation of the wafer exposure which the area of interest (AOI) of mask 420 and the design geometry information associated with the AOI would generate if an exposure had been performed under the same conditions as lithography conditions input 445 and using a mask having the parameters as provided in metrology data input 455). Similarly, image simulator 460 can generate simulated process window 480 (representing the effect the potential defect area has on the process window), and/or a performance output 482. Furthermore, in one embodiment, image simulator 460 is able to generate simulated wafer image 470 for a potential defect area of a mask of a number of different types of mask design including bright field and dark field. Simulated wafer image 470, simulated process window 480, and/or performance output 482 can then be inspected to determine the printability of any identified potential defect area without actually taking the expense of exposing a real wafer with the mask. Finally, in other embodiments, image simulator 460 could take into account the parameters associated with the photoresist material to be used and/or the etching process to be used on the exposed wafer in order to simulate the end result of these processes 484.

Figure 5:
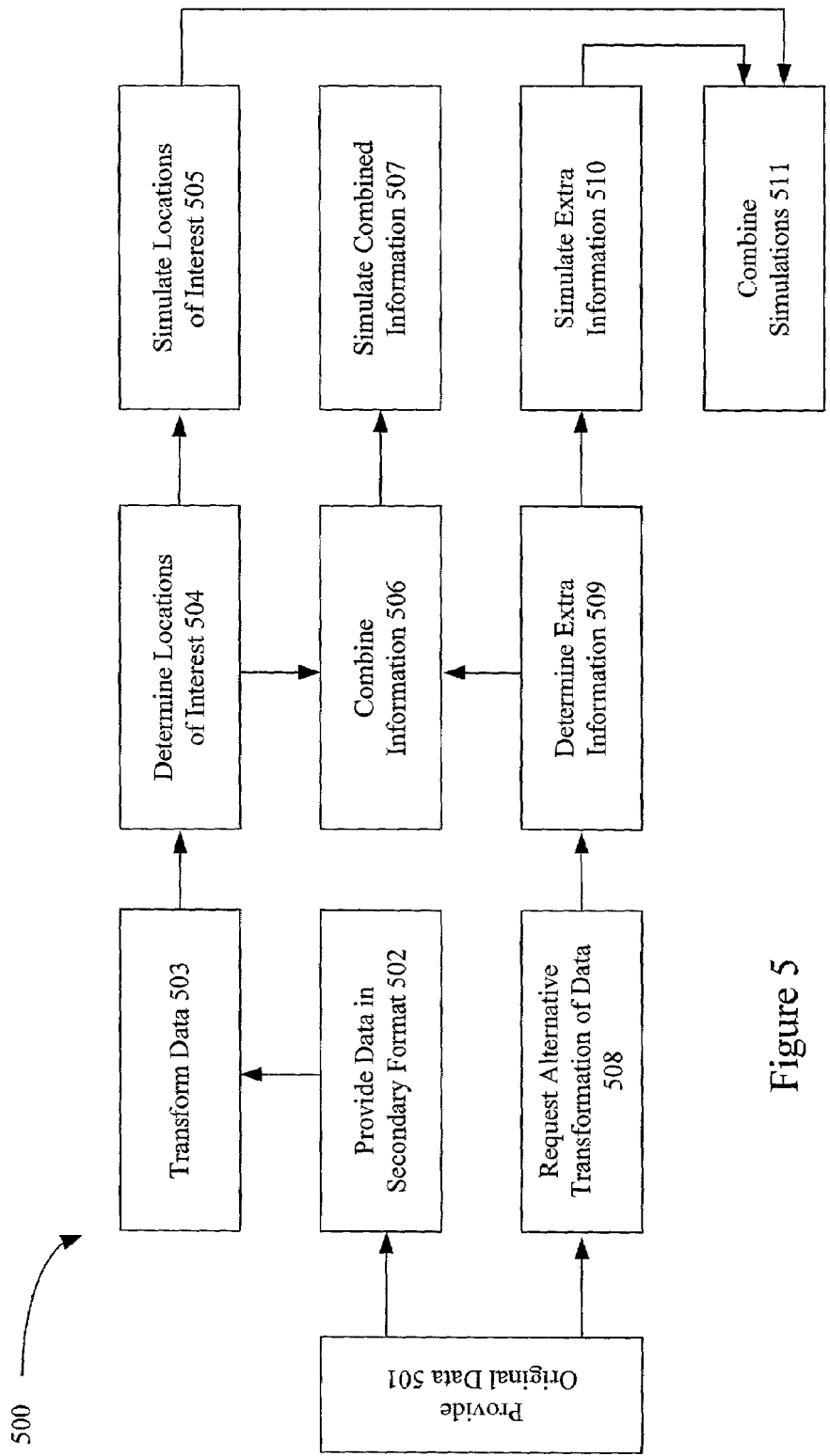
FIG. 5 illustrates a flow diagram indicating various processes for simulating based on combining inspection information and design geometry information.

FIG. 5 illustrates a flow diagram 500 indicating various processes for simulating based on combining inspection information and design geometry information. For example, in a first process flow, original data can be provided in step 501. This original data can be provided in a secondary format in step 502 and then transformed, e.g. physically implemented, in step 503. The data in locations of interest can be determined in step 504 and then simulated in step 505.

In step 508, an alternative transformation of the original data can be requested. In one embodiment, this transformation allows extra information to be determined in step 509. The extra information can be provided simulated in step 510. Note that the simulated information from steps 505 and 510 can be combined in step 511.

In a second process flow, steps 501–504 and 508 are identical to those described in the first process flow. However, in the second process flow, the output from steps 504 and 509, i.e. locations of interest and extra information, can be combined in step 506 and then simulated in step 507.

An exemplary (first or second) process flow could include using a GDS-II file in step 501, providing a MEBES file in step 502, fabricating a mask in step 503, inspecting that mask and identifying defects in step 504, requesting design geometry information in step 508, and receiving the design geometry information in step 509. Note that the simulating provided in steps 505, 507, and 510 could be done by the same or different equipment. Another exemplary process flow for simulating a mask could include using a GDS-II file in step 501, determining a layout pattern for one layer in step 502, dividing the layout pattern into a plurality of sections in step 503, identifying the sections to be simulated in step 504, and simulating the writing (e.g. e-beam or laser) of those sections in step 505. In this process flow, requesting design geometry information in step 508 and receiving the design geometry information in step 509 can be used to improve the simulation accuracy of the writing of the mask.

Figure 6C:
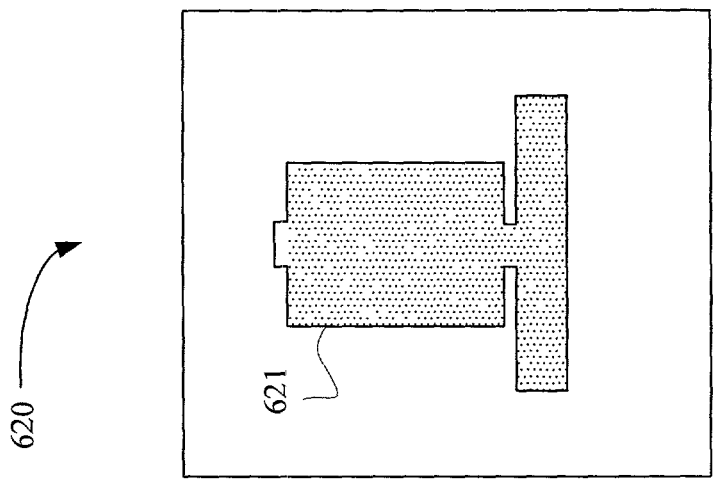
FIG. 6C illustrates a trim mask that can be exposed after or at the same time as the phase shifting mask shown in FIG. 6B to form the remainder of the feature shown in FIG. 6A.
Figure 6B:
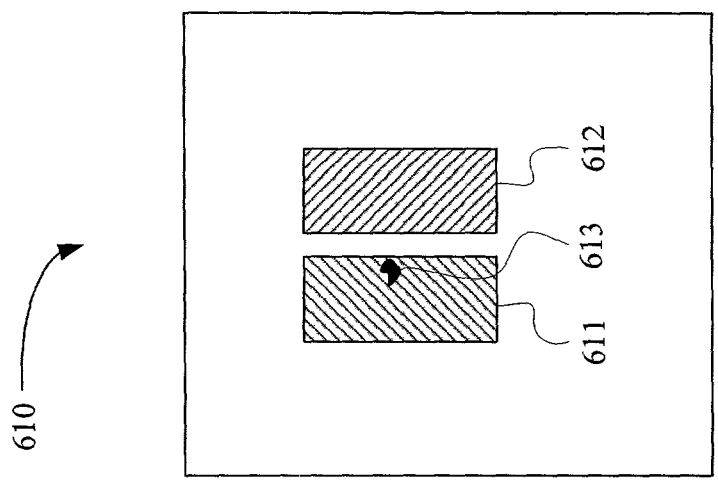
FIG. 6B illustrates a corresponding phase shifting mask to define a portion of the feature shown in FIG. 6A.
Figure 6A:
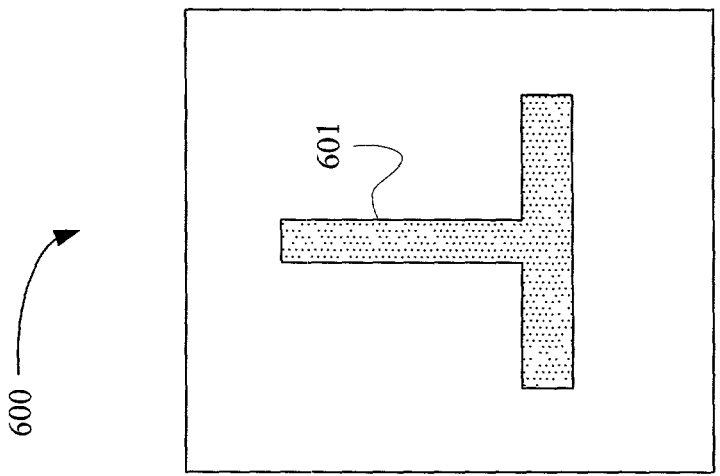
FIG. 6A illustrates a simplified layout to form a mask feature.

Advantageously, process flow 500 can also be used for simulating a wafer using a phase-shifting mask. FIG. 6A illustrates a simplified layout 600 for forming a wafer feature 601. FIG. 6B illustrates a corresponding phase-shifting mask 610 to define a portion of feature 601. For example, feature 601 could form a transistor in a polysilicon layer and shifters 611 and 612 (having different phase) in PSM 610 could define a gate of this transistor. In PSM 610, shifter 611 includes a defect 613. Note that PSM 610 is typically a dark field mask, and thus defect 613 is shown as opaque (wherein the area of PSM 610 surrounding shifters 611 and 612 would also be opaque, although not shown). FIG. 6C illustrates a trim mask 620 that can be exposed after or at the same time as PSM 610. Trim mask 620 includes a structure 621 that can protect the portion of feature 601 created by shifters 611 and 612 as well as form the remainder of feature 601. Note that structure 621 would also be provided in a trim layout (and shifters 611 and 612 would be provided in a PSM layout) that would be associated with feature 601.

In accordance with one embodiment, a GDS II file provided in step 501 could include layout information regarding feature 601, shifters 611 and 612, as well as structure 621. (Note that in an alternative embodiment, information regarding feature 601 is not necessary and can be omitted from the GDS II file.) The information regarding shifters 611 and 612 could be extracted in step 502 and used to make a PSM mask in step 503. In step 504, defect 613 on shifter 611 could be located. The information regarding feature 601 could be requested in step 508, thereby accessing trim layout information regarding structure 621 in step 509. The inspection information from the PSM mask as well as the database information from the trim layout could be combined in step 506 and used to provide an accurate wafer simulation of feature 600 in step 507. Alternatively, the inspection information from the PSM mask could be simulated in step 505, the database information from the trim layout could be simulated in step 510, and the simulated information from steps 505 and 510 could be combined in step 511. Note that process 500 is equally applicable when using inspection information from a trim mask and database information from the PSM layout.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art. For example, the area of interest (AOI) could be defined as including only defect information. In this case, the rest of the composite image could be provided by design geometry information. Moreover, note that the term "image" used extensively herein refers generally to information representing an image and therefore is not limited to information in a specific format. Finally, the system and methods described herein can be applied to any lithographic process technologies, including ultraviolet, deep ultraviolet (DUV), extreme ultraviolet (EUV), x-ray, and ebeam. Accordingly, it is intended that the scope of the invention be defined by the following Claims and their equivalents.

What is claimed is:

1. A method of simulating an area of interest (AOI) on a mask, the method comprising:
  identifying the AOI;
  generating an inspection image of the AOI;
  providing design geometry information regarding an area outside the AOI without use of inspection images of that area; and
  performing a simulation of the AOI based on the inspection image and the design geometry information.

2. The method of claim 1, wherein providing design geometry information includes modifying data representing an area surrounding the AOI.

3. The method of claim 2, wherein modifying data includes generating a virtual image of the area outside the AOI and combining the inspection image and the virtual image.

4. The method of claim 3, wherein performing the simulation includes receiving the combined images.

5. The method of claim 2, wherein modifying data includes generating a virtual image of the area outside the AOI and performing the simulation includes receiving the inspection image and the virtual image.

6. The method of claim 5, wherein performing the simulation further includes combining the inspection image and the virtual image.

7. The method of claim 1, wherein providing design geometry information includes accessing at least one of a GDS-II file, a MEBES file, and a bit map.

8. The method of claim 1, wherein providing design geometry information includes extending geometries of a feature in the AOI.

9. The method of claim 1, wherein providing design geometry information includes accessing information regarding another mask.

10. The method of claim 9, wherein providing design geometry information includes accessing information regarding at least one of a trim mask and a phase shifting mask.

11. Data for a simulation engine, the data comprising:
   first information from an inspection tool, the first information relating to a first area; and
   second information from a design file, the second information relating to a second area outside the first area,
   wherein the first information and the second information provide enhanced simulation accuracy for the first area.

12. The data of claim 11, wherein the design file includes at least one of a GDS-II file, a MEBES file, and a bit map.

13. The data of claim 11, wherein the second area is defined by at least one predetermined distance from a perimeter of the first area.

14. The data of claim 11, wherein the second area is defined by a plurality of distances from a perimeter of the first area.

15. The data of claim 11, wherein the first area is user defined.

16. The data of claim 11, wherein the first and second areas are system defined.

17. The data of claim 11, wherein the first area relates to a first mask and the second area relates to a second mask associated with the first mask.

18. A system for simulating a defect on a mask, the system comprising:
   means for identifying an area of interest (AOI) including the defect;
   means for providing an inspection image of the AOI;
   means for providing design geometry information regarding an area surrounding the AOI; and
   means for performing a simulation of the AOI based on the inspection image and the design geometry information.

19. The system of claim 18, wherein the means for providing design geometry information includes means for modifying data representing an area surrounding the AOI.

20. The system of claim 19, wherein the means for modifying data includes means for generating a virtual image of the area surrounding the AOI and combining the inspection image and the virtual image.

21. The system of claim 19, wherein the means for modifying data includes means for generating a virtual image of the area surrounding the AOI and the means for performing the simulation includes means for receiving the inspection image and the virtual image.

22. The system of claim 18, wherein the means for providing design geometry information includes at least one of a GDS-II file, a MEBES file, and a bit map.

23. The system of claim 18, wherein the means for providing design geometry information includes means for extending at least one geometry of a feature in the AOI to a predetermined distance.

24. The system of claim 18, wherein the means for providing design geometry information includes means for accessing database information regarding another mask.

25. A simulated image of an area of interest on a wafer, the simulated image comprising:
   a feature, wherein the feature has an accuracy based on a mask inspection image having a defined area and design geometry information outside the defined area.

26. A method of improving simulation accuracy for an area of interest on a mask, the method comprising:
   generating a mask inspection image having a defined area, wherein simulating the mask inspection image provides a first accuracy; and
   combining the mask inspection image with design geometry information outside the defined area to create a composite image, wherein simulating the composite image provides an improved accuracy compared to the first accuracy.

27. A computer program product for simulating an area of interest (AOI) on a mask, the computer program product comprising:
   a first set of instructions for receiving inspection information regarding the AOI;
   a second set of instructions for receiving design geometry information regarding an area outside the AOI; and
   a third set of instructions for performing a simulation of the AOI based on the inspection information and the design geometry information.

* * * * *